United States Patent
Isoda et al.

(10) Patent No.: US 7,211,922 B2
(45) Date of Patent: *May 1, 2007

(54) ROTOR FOR ROTATING ELECTRIC MACHINE

(75) Inventors: Hitoshi Isoda, Tokyo (JP); Yoshihito Asao, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/555,442

(22) PCT Filed: Feb. 15, 2005

(86) PCT No.: PCT/JP2005/002214

§ 371 (c)(1),
(2), (4) Date: Nov. 3, 2005

(87) PCT Pub. No.: WO2005/078894

PCT Pub. Date: Aug. 25, 2005

(65) Prior Publication Data

US 2006/0055280 A1    Mar. 16, 2006

(30) Foreign Application Priority Data

Feb. 17, 2004  (JP)  .............................. 2004-040274

(51) Int. Cl.
*H02K 1/22* (2006.01)
(52) U.S. Cl. ............. 310/263; 310/156.72; 310/156.73
(58) Field of Classification Search ................ 310/263, 310/156.66, 156.72, 156.73
See application file for complete search history.

(56) References Cited

U.S. PATENT DOCUMENTS

| 4,617,485 A | * | 10/1986 | Nakamura et al. ............ 310/65 |
| 5,536,987 A | * | 7/1996 | Hayashi et al. ............. 310/263 |
| 5,907,209 A | * | 5/1999 | Ishida ........................ 310/263 |
| 6,002,194 A | * | 12/1999 | Asao ........................... 310/269 |
| 6,097,130 A | * | 8/2000 | Umeda et al. ............... 310/263 |
| 6,104,118 A | * | 8/2000 | Kanazawa et al. .......... 310/263 |
| 6,531,802 B2 | * | 3/2003 | Umeda ....................... 310/263 |
| 6,548,935 B1 | * | 4/2003 | Shendi et al. ............... 310/263 |

FOREIGN PATENT DOCUMENTS

| JP | 4-325853 A | 11/1992 |
| JP | 8-98481 A | 4/1996 |
| JP | 11-164499 A | 6/1999 |
| JP | 2003-18808 A | 1/2003 |

* cited by examiner

Primary Examiner—Tran Nguyen
(74) Attorney, Agent, or Firm—Sughrue Mion, PLLC

(57) ABSTRACT

The present invention provides a dynamoelectric rotor enabling electromagnetic noise to be reduced by linking a facing tip end portion and root end portion of adjacent claw-shaped magnetic poles by a linking member and placing a field winding in contact with an inner peripheral surface of the claw-shaped magnetic poles in an electrically-insulated state so as to suppress vibration of the claw-shaped magnetic poles effectively.

In the present invention, a tip end portion and a root end portion of adjacent claw-shaped magnetic poles are linked by a linking structure, and a field winding is wound onto a boss portion so as to have a larger diameter than a root inside diameter of the claw-shaped magnetic poles and is placed in contact with an inner peripheral surface of at least one of the claw-shaped magnetic poles with an insulating member interposed.

13 Claims, 11 Drawing Sheets

ROTOR FOR ROTATING ELECTRIC MACHINE

TECHNICAL FIELD

The present invention relates to a dynamoelectric rotor for an alternator, an electric motor, etc., and particularly to a rotor construction for reducing electromagnetic noise due to magnetic vibration of a rotor core.

BACKGROUND ART

In conventional automotive alternator rotors, a rotor core includes: a cylindrical portion on which a field winding is installed with an insulating member interposed; yoke portions disposed so as to extend radially outward from each of two axial end portions of the cylindrical portion; and a plurality of claw-shaped magnetic poles bent so as to extend axially from outer peripheral portions of each of the yoke portions and intermesh with each other alternately so as to cover the field winding. A predetermined clearance is disposed between adjacent claw-shaped magnetic poles so as to prevent magnetic flux from leaking out from between the adjacent claw-shaped magnetic poles. In addition, ring-shaped vibration damping members are disposed so as to be placed in close contact with inner peripheral surfaces of the claw-shaped magnetic poles and an outer peripheral surface of the field winding. (See Patent Literature 1, for example.)

An automotive alternator having a Lundell rotor of this kind has a power generating function in which magnetic flux is generated by passing an electric current to the field winding and an alternating current flows through an armature winding due to changes in the magnetic flux arising together with rotation of the rotor.

Patent Literature 1: Japanese Patent Laid-Open No. HEI 4-325853 (Gazette)

DISCLOSURE OF INVENTION PROBLEM TO BE SOLVED BY THE INVENTION

In a Lundell rotor, magnetic force resonance of the claw-shaped magnetic poles is generated as a result of the changes in the magnetic flux generated by passing the electric current to the field winding. In conventional automotive alternator rotors, the vibration damping members are disposed so as to be placed in close contact with inner peripheral surfaces of the claw-shaped magnetic poles and an outer peripheral surface of the field winding so as to reduce the magnetic force resonance of the claw-shaped magnetic poles.

However, in conventional automotive alternator rotors, sufficient reductions in electromagnetic noise have not been achieved because the vibration damping members are disposed so as to contact axially central portions of the inner peripheral surfaces of the claw-shaped magnetic poles or so as to contact root end portions of the inner peripheral surfaces of the claw-shaped magnetic poles, making the vibration suppressing effect on the claw-shaped magnetic poles poor since the tip end portions of the claw-shaped magnetic poles, which are easily displaced, cannot be restrained thereby.

The present invention aims to solve the above problems and an object of the present invention is to provide a dynamoelectric rotor enabling electromagnetic noise to be reduced by linking a facing tip end portion and root end portion of adjacent claw-shaped magnetic poles by a linking member and placing a field winding in contact with an inner peripheral surface of the claw-shaped magnetic poles in an electrically-insulated state so as to suppress vibration of the claw-shaped magnetic poles effectively.

MEANS FOR SOLVING PROBLEM

In order to achieve the above object, according to one aspect of the present invention, there is provided a dynamoelectric rotor including: a Lundell rotor core having: a cylindrical boss portion; yoke portions respectively disposed so as to extend radially outward from two axial end edge portions of the boss portion; and a plurality of claw-shaped magnetic poles disposed so as to extend axially from outer peripheral portions of the yoke portions so as to intermesh with each other alternately; a field winding installed on the boss portion; and a linking structure made of a nonmagnetic material for linking a tip end portion and a root end portion of at least one adjacent pair of the claw-shaped magnetic poles, wherein: the field winding is wound onto the boss portion so as to have a larger diameter than a root inside diameter of the claw-shaped magnetic poles and is placed in contact with an inner peripheral surface of at least one of the claw-shaped magnetic poles with an insulating member interposed.

EFFECTS OF THE INVENTION

According to the present invention, because the tip end portion of the claw-shaped magnetic pole, which vibrates easily, is linked to the root end portion of the adjacent claw-shaped magnetic pole, which does not vibrate easily, vibration of the tip end portion of the claw-shaped magnetic pole is suppressed, reducing electromagnetic noise. In addition, because the field winding is placed in contact with the inner peripheral surface of the claw-shaped magnetic poles, overall rigidity of the claw-shaped magnetic poles is raised, suppressing vibration of the claw-shaped magnetic poles and reducing electromagnetic noise.

BEST MODE FOR CARRYING OUT THE INVENTION

Embodiment 1

Figure 1:
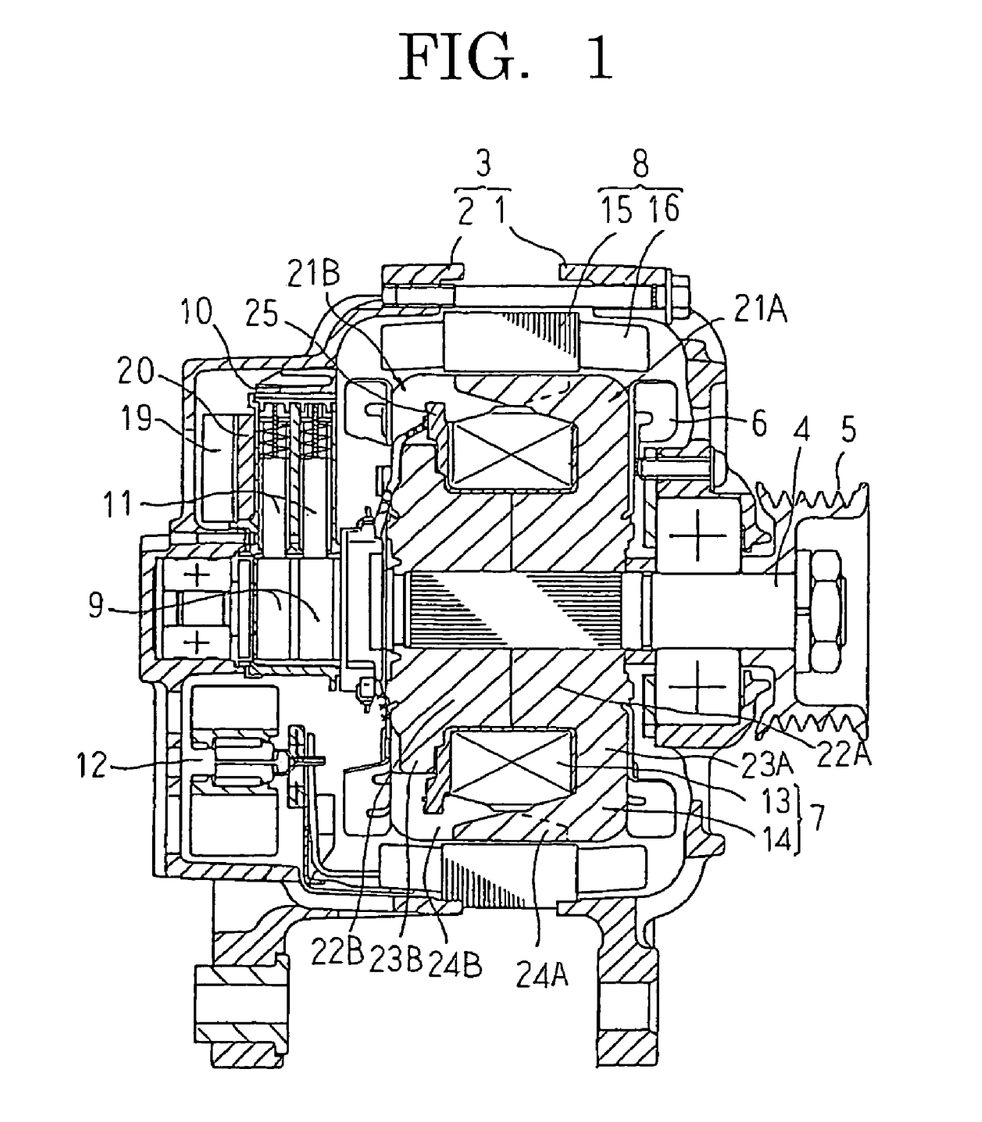
FIG. 1 is a longitudinal section showing a dynamoelectric machine mounted with a rotor according to Embodiment 1 of the present invention.
Figure 2:
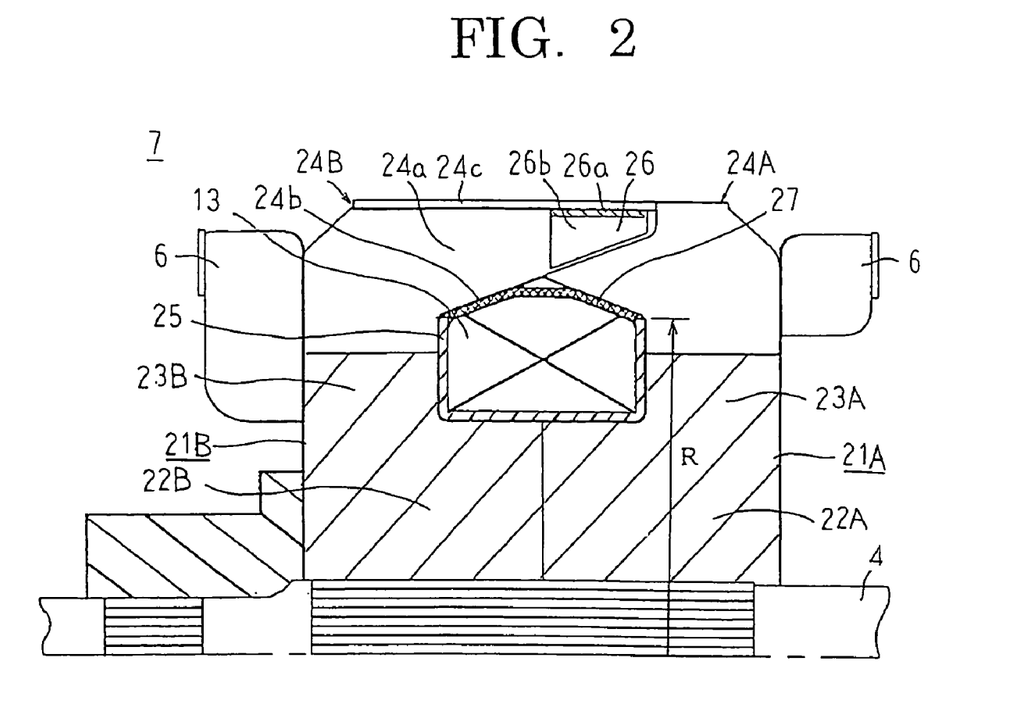
FIG. 2 is a longitudinal section showing part of the dynamoelectric machine mounted with the rotor according to Embodiment 1 of the present invention.
Figure 3:
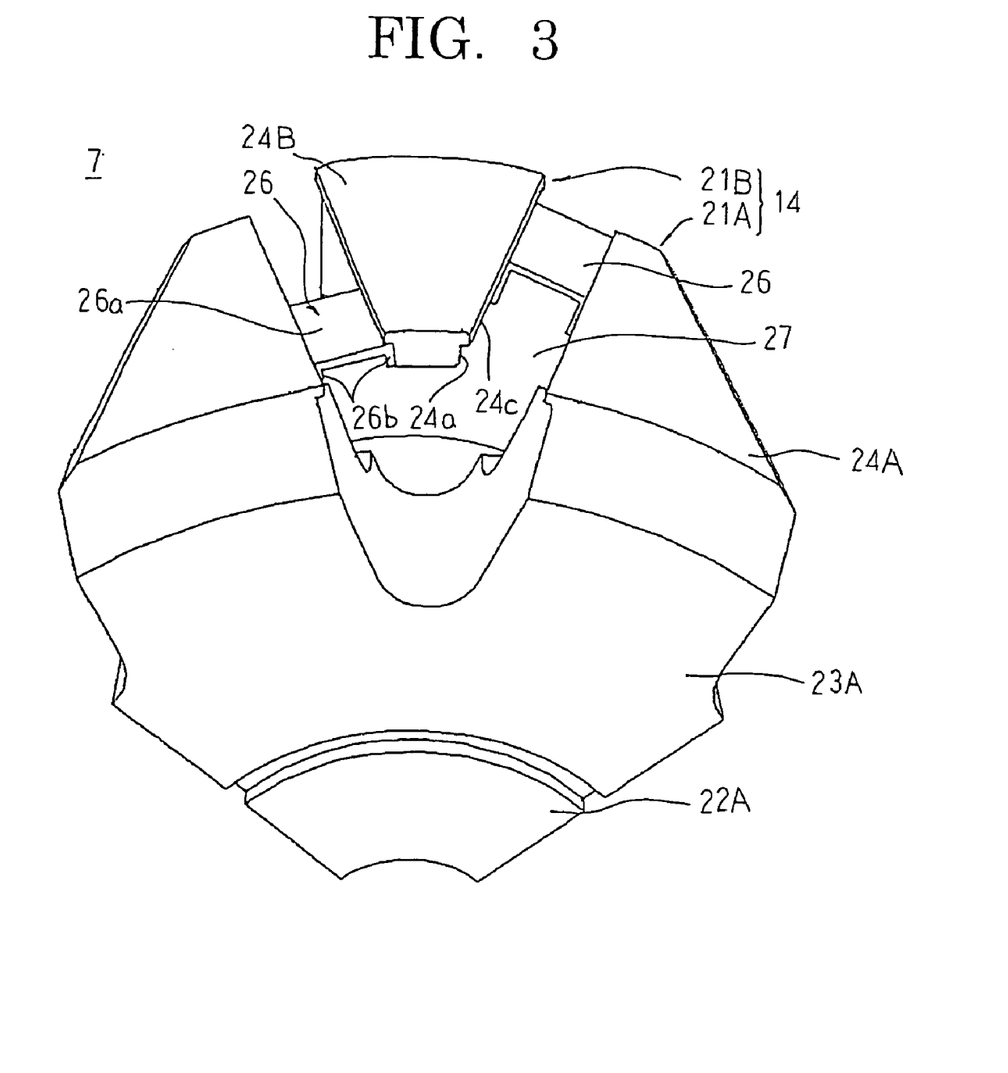
FIG. 3 is a perspective showing part of the dynamoelectric rotor according to Embodiment 1 of the present invention.

FIG. 1 is a longitudinal section showing a dynamoelectric machine mounted with a rotor according to Embodiment 1 of the present invention, FIG. 2 is a longitudinal section showing part of the dynamoelectric machine mounted with the rotor according to Embodiment 1 of the present invention, and FIG. 3 is a perspective showing part of the dynamoelectric rotor according to Embodiment 1 of the present invention.

In FIG. 1, a dynamoelectric machine includes: a case 3 constituted by a front bracket 1 and a rear bracket 2 that are each generally cup-shaped and made of aluminum; a shaft 4 rotatably supported by the case 3; a pulley 5 affixed to a first end of the shaft 4 projecting outward at a front end of the case 3; a rotor 7 affixed to the shaft 4 and rotatably disposed in the case 3; an armature 8 held by an inner wall surface of the case 3 so as to surround the rotor 7; a pair of slip rings 9 fixed to a second end portion of the shaft 5; a brush holder 10 disposed on an outer periphery of the slip rings 9; brushes 11 disposed inside the brush holder 10 so as to slide in contact with each of the slip rings 9; a rectifier 12 that is electrically connected to the armature 8 so as to covert alternating current generated in the armature 8 into direct current; a heat sink 19 fitted onto the brush holder 10; and a voltage regulator 20 affixed to the heat sink 19 using an adhesive, the voltage regulator 20 adjusting magnitude of alternating voltage generated in the armature 8.

The armature 8 includes: an armature core 15 disposed so as to be held between the front bracket 1 and the rear bracket 2 and surround the rotor 7; and an armature winding 16 installed in the armature core 15.

As shown in FIGS. 2 and 3, the rotor 7 includes: a field winding 13 for generating magnetic flux on passage of electric current; and a Lundell rotor core 14 disposed so as to cover the field winding 13, magnetic poles being formed in the rotor core 14 by the magnetic flux. The rotor core 14 is constituted by first and second cores 21A and 21B made of iron. The first core 21A includes: a cylindrical first boss portion 22A; a first yoke portion 23A disposed so as to extend radially outward from a first axial end edge portion of the first boss portion 22A; and first claw-shaped magnetic poles 24A each disposed so as to extend toward a second axial end from an outer peripheral portion of the first yoke portion 23A. Similarly, the second core 21B includes: a cylindrical second boss portion 22B; a second yoke portion 23B disposed so as to extend radially outward from a second axial end edge portion of the second boss portion 22B; and second claw-shapea magnetic poles 24B each disposed so as to extend toward a first axial end from an outer peripheral portion of the second yoke portion 23B. Eight first claw-shaped magnetic poles 24A and eight second claw-shaped magnetic poles 24B, for example, are each arranged at a predetermined pitch circumferentially. In addition, each of the first and second claw-shaped magnetic poles 24A and 24B are formed such that radially-outermost peripheral surfaces thereof form a trapezoidal shape constituted by a tip end circumferential short side, a base end portion circumferential long side, and two oblique sides, and circumferential side surfaces 24a thereof are each formed so as to have a tapered shape constituted by a tip end radial short side, an oblique side constituting the outermost peripheral surface, and an oblique side joining a lower end of the tip end radial short side and an inner peripheral root portion of the first and second claw-shaped magnetic poles 24A and 24B. The first and second cores 21A and 21B are integrated by abutting a second end surface of the first boss portion 22A and a first end surface of the second boss portion 22B, disposing the first and second claw-shaped magnetic poles 24A and 24B so as to intermesh with each other, and pressing the shaft 4 through a central axial position of the first and second boss portions 22A and 22B.

Inner peripheral surfaces 24b of the first and second claw-shaped magnetic poles 24A and 24B form a trapezoidal shape in a similar manner to that of the outermost peripheral surfaces, and are formed into inclined surfaces extending radially outward from a root toward a tip end portion. In addition, securing portions 24c are disposed so as to protrude circumferentially from intersecting portions between the circumferential side surfaces 24a and the outermost circumferential surfaces of the first and second claw-shaped magnetic poles 24A and 24B.

Linking structures 26 are made into an angular C shape using a nonmagnetic material, and are disposed so as to link a tip end portion and a root end portion of adjacent first and second claw-shaped magnetic poles 24A and 24B. Each of the linking structures 26 is engaged in securing portions 24c with a base side 26a of the angular C shape facing radially outward, and is joined to the first and second claw-shaped magnetic poles 24A and 24B using an adhesive such as a varnish, etc., with two side edges 26b of the angular C shape placed in close contact with the facing circumferential side surfaces 24a.

The field winding 13 is wound onto a bobbin 25 mounted to the first and second boss portions 22A and 22B, and is covered by the first and second claw-shaped magnetic poles 24A and 24B. Here, the field winding 13 is wound so as to have a larger diameter than a root inside diameter R of the first and second claw-shaped magnetic poles 24A and 24B, and is also installed such that an insulating member 27 made of a resin-impregnated tape impregnated with a resin such as an epoxy, etc., for example, surrounds an outer periphery of the field winding 13. The insulating member 27 is placed in contact with the inner peripheral surfaces 24b of the first and second claw-shaped magnetic poles 24A and 24B.

In addition, fans 6 are fixed to a first axial end surface of the first core 21A and a second axial end surface of the second core 21B, respectively.

Operation of a dynamoelectric machine configured in this manner when used as an automotive alternating-current electric motor will now be explained.

During starting of an engine (not shown), alternating current is supplied sequentially to each of three phases of the armature winding 16 by a three-phase drive circuit (not shown), and field current is supplied to the field winding 13 by means of the brushes 11 and the slip rings 9. Thus, the armature winding 16 and the field winding 13 become electromagnets, and the rotor 7 rotates inside the armature 8 together with the shaft 4. Torque from the shaft 4 is transmitted to an output shaft of the engine by means of the pulley 5, starting the engine.

Next, operation of the dynamoelectric machine when used as an automotive alternator will be explained.

Once the engine has been started, torque from the engine is transmitted to the shaft 4 by means of the pulley 5, rotating the shaft 4. Thus, when field current is supplied to the field winding 13 by means of the brushes 11 and the slip rings 9, the field winding 13 is excited and becomes an electromagnet. By rotating the rotor 7 inside the armature 8 in this state, alternating current is induced sequentially in the armature winding 16 installed in the armature core 15 and generated voltage rises rapidly. This three-phase alternating current is input into the rectifier 12 and rectified into direct current. Direct-current voltage rectified by the rectifier 12 charges a battery (not shown), etc., and is supplied to an electric load (not shown).

The fans 6 also rotate with the rotor 7, making cooling airflows flow into the case 3 from a front end and a rear end. A cooling airflow flowing in through the front bracket 1 is deflected centrifugally by the fans 6, cools coil ends of the armature winding 16, and is then discharged through the front bracket 1. Similarly, a cooling airflow flowing in through the rear bracket 2 cools the rectifier 12 and the voltage regulator 20, is then deflected centrifugally by the fans 6, cools coil ends of the armature winding 16, and is then discharged through the rear bracket 1. Thus, temperature increases are suppressed in the rectifier 12, the voltage regulator 20, and the armature 8, which are heat-generating parts.

In the Lundell rotor core 14, the tip end portions of the first and second claw-shaped magnetic poles 24A and 24B have a cantilever beam construction that vibrates easily. However, using Embodiment 1, vibration of the tip end portions of the first and second claw-shaped magnetic poles 24A and 24B is suppressed because the tip end portions and the root end portions of adjacent first and second claw-shaped magnetic poles 24A and 24B are linked by the linking structures 26, reducing electromagnetic noise.

In addition, the field winding 13 is wound so as to have a larger diameter than the root inside diameter R of the first and second claw-shaped magnetic poles 24A and 24B, and the insulating member 27 is installed so as to surround the outer periphery of the field winding 13 and is placed in contact with the inner peripheral surfaces 24b of the first and second claw-shaped magnetic poles 24A and 24B. In other words, the field winding 13 is placed in contact with the inner peripheral surfaces 24b of the first and second claw-shaped magnetic poles 24A and 24B while ensuring an electrically-insulated state. Thus, overall rigidity of the claw-shaped magnetic poles constituted by the first and second claw-shaped magnetic poles 24A and 24B is increased. Furthermore, because the linking structures 26 link the adjacent first and second claw-shaped magnetic poles 24A and 24B, vibration of the first and second claw-shaped magnetic poles 24A and 24B is damped by individual damping by the linking structures 26, and by frictional damping between the linking structures 26 and the first and second claw-shaped magnetic poles 24A and 24B. Thus, vibration of the first and second claw-shaped magnetic poles 24A and 24B is suppressed, reducing electromagnetic noise.

In addition, because the linking structures 26 are mounted so as to engage with the securing portions 24c disposed on the intersecting portions between the circumferential side surfaces 24a and the outermost circumferential surfaces of the first and second claw-shaped magnetic poles 24A and 24B, centrifugal force arising in the linking structures 26 due to the rotation of the rotor 7 is borne by the securing portions 24c, preventing scattering of the linking structures 26.

Moreover, in Embodiment 1 above, the insulating member 27 is configured by winding resin-impregnated tape onto the outer peripheral surface of the field winding 13 installed on the first and second boss portions 22A and 22B, but the insulating member may also be configured by extending a flange at one end of a bobbin 25 having an angular C-shaped cross section and folding over the extended portion in question so as to cover the outer peripheral surface of the field winding 13, or the insulating member may also be configured by applying and hardening an adhesive having electrically-insulating properties on the outer peripheral surface of the field winding 13 installed in the first and second boss portions 22A and 22B.

In Embodiment 1 above, the linking structures 26 are joined to the first and second claw-shaped magnetic poles 24A and 24B using an adhesive, but if linking structures are made of a metal such as SUS 304, etc., the linking structures can also be joined to the first and second claw-shaped magnetic poles 24A and 24B by welding.

Embodiment 2

Figure 4:
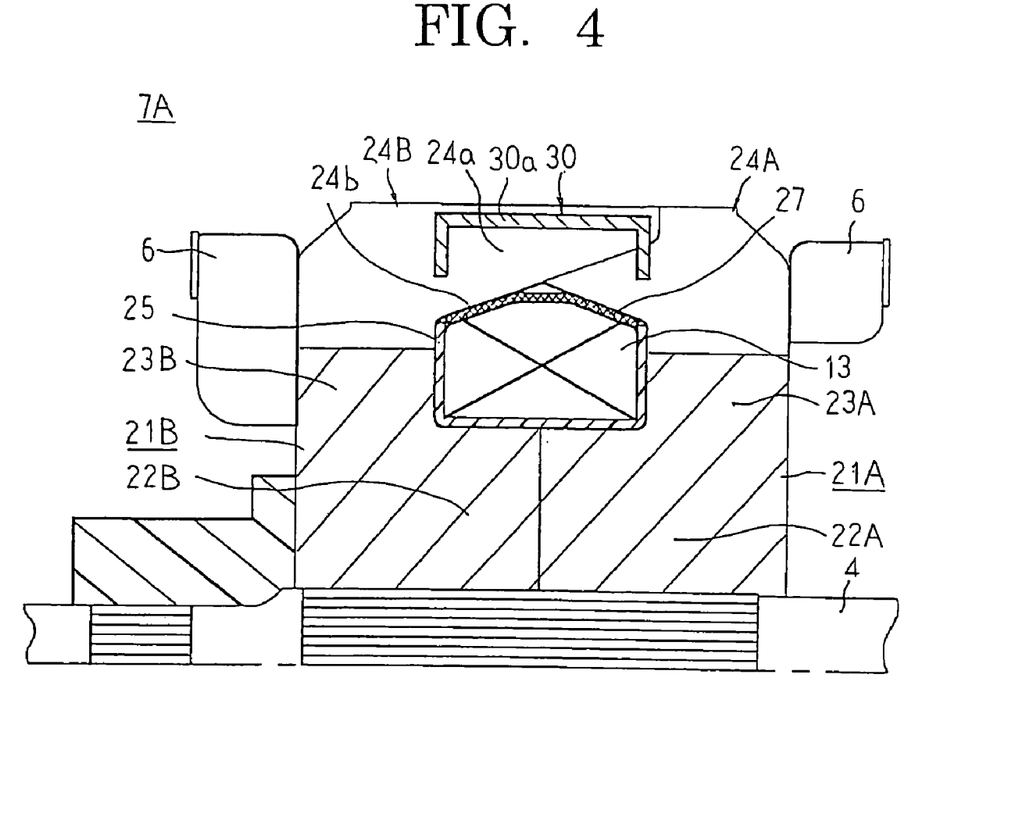
FIG. 4 is a longitudinal section showing part of a dynamoelectric machine mounted with a rotor according to Embodiment 2 of the present invention.
Figure 5:
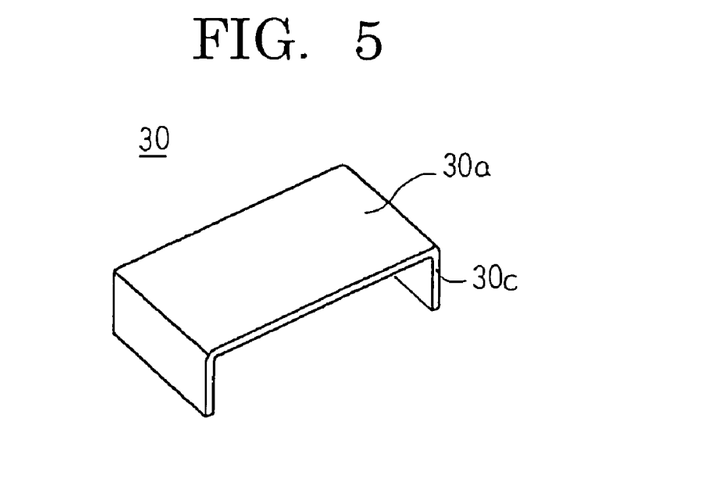
FIG. 5 is a perspective showing a linking structure used in the rotor according to Embodiment 2 of the present invention.

FIG. 4 is a longitudinal section showing part of a dynamoelectric machine mounted with a rotor according to Embodiment 2 of the present invention, and FIG. 5 is a perspective showing a linking structure used in the rotor according to Embodiment 2 of the present invention.

In FIGS. 4 and 5, linking structures 30 are made into an angular C-shaped cross section using a nonmagnetic metal such as SUS 304, etc., and are disposed so as to link adjacent first and second claw-shaped magnetic poles 24A and 24B over a region extending from a tip end portion to a root end portion. Each of the linking structures 30 is oriented with a base side 30a of the angular C shape facing radially outward, and is joined to the first and second claw-shaped magnetic poles 24A and 24B using an adhesive such as a varnish, etc., or by welding, etc., with two side edges 30b of the angular C shape placed in close contact with facing circumferential side surfaces 24a.

Moreover, the rest of this embodiment is configured in a similar manner to Embodiment 1 above.

In a rotor 7A configured in this manner, the linking structures 30 also link the adjacent first and second claw-shaped magnetic poles 24A and 24B, the field winding 13 is wound so as to have a larger diameter than a root inside diameter of the first and second claw-shaped magnetic poles 24A and 24B, and the insulating member 27 is installed so as to surround an outer periphery of the field winding 13 and is placed in contact with the inner peripheral surfaces 24b of the first and second claw-shaped magnetic poles 24A and 24B. Thus, overall rigidity of the claw-shaped magnetic poles constituted by the first and second claw-shaped magnetic poles 24A and 24B is increased, and the linking structures 30 act so as to damp vibration of the first and second claw-shaped magnetic poles 24A and 24B. Thus, vibration of the first and second claw-shaped magnetic poles 24A and 24B is suppressed, reducing electromagnetic noise.

In the rotor 7A, because the adjacent first and second claw-shaped magnetic poles 24A and 24B are linked by the linking structures 30 over a region extending from a tip end portion to a root end portion, vibration not only of the claw tip end portion, but of the entire claw of the first and second claw-shaped magnetic poles 24A and 24B is suppressed, further reducing electromagnetic noise. In addition, even if circumstances arise in which the outer periphery of the rotor core 14 must be machined after assembling the rotor 7A in order to increase outer peripheral precision of the rotor core 14, the linking structures 30 blocking gaps between adjacent first and second claw-shaped magnetic poles 24A and 24B over a region extending from the tip end portion to the root end portion prevent cuttings generated by machining from penetrating inside the rotor magnetic poles. Thus, the occurrence of insulation failure between the field winding 13 and the rotor core 14 resulting from penetration of the cuttings is suppressed, enabling fraction defective to be reduced.

Embodiment 3

Figure 6:
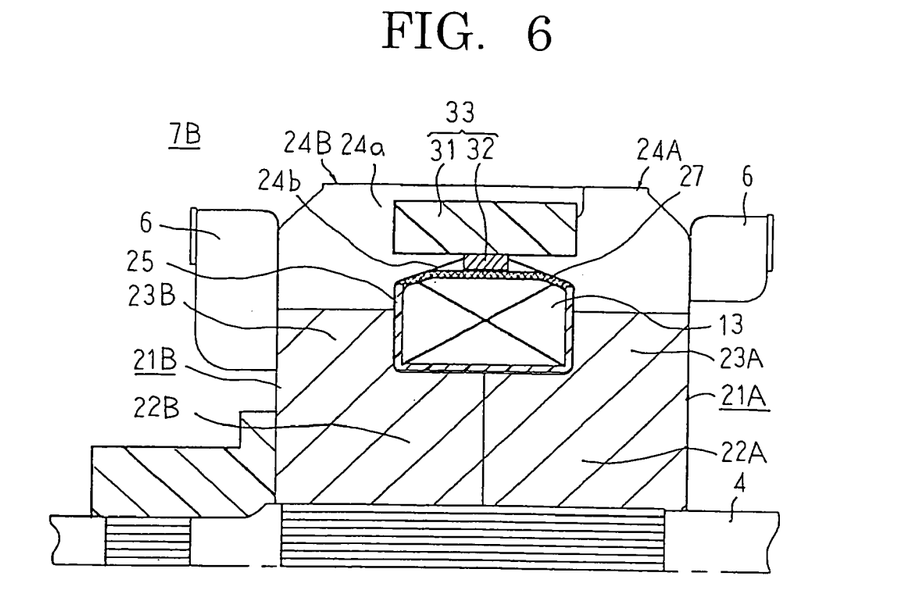
FIG. 6 is a longitudinal section showing part of a dynamoelectric machine mounted with a rotor according to Embodiment 3 of the present invention.
Figure 7:
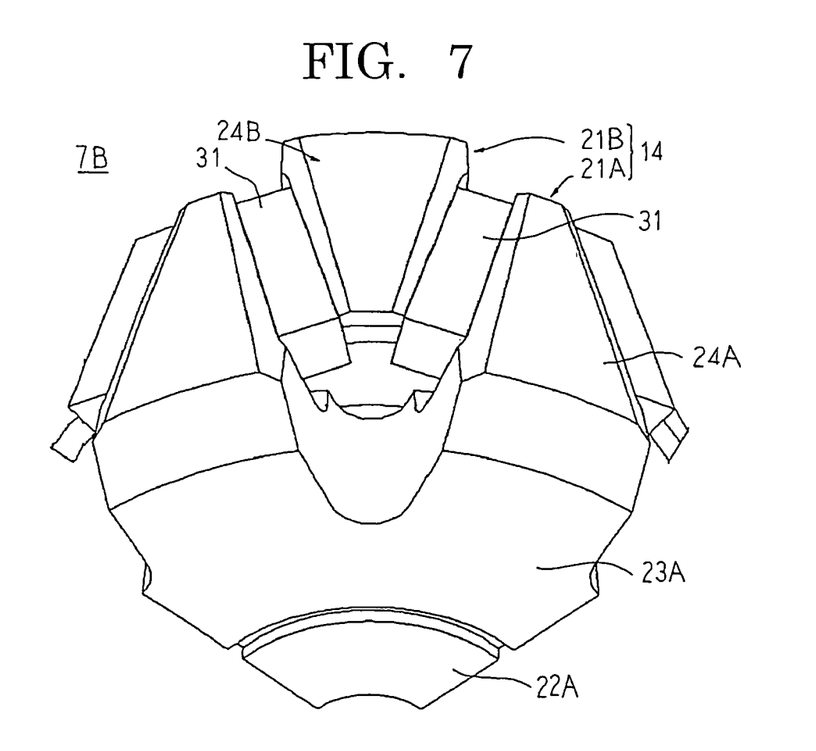
FIG. 7 is a perspective showing part of the dynamoelectric machine mounted with the rotor according to Embodiment 3 of the present invention.
Figure 8:
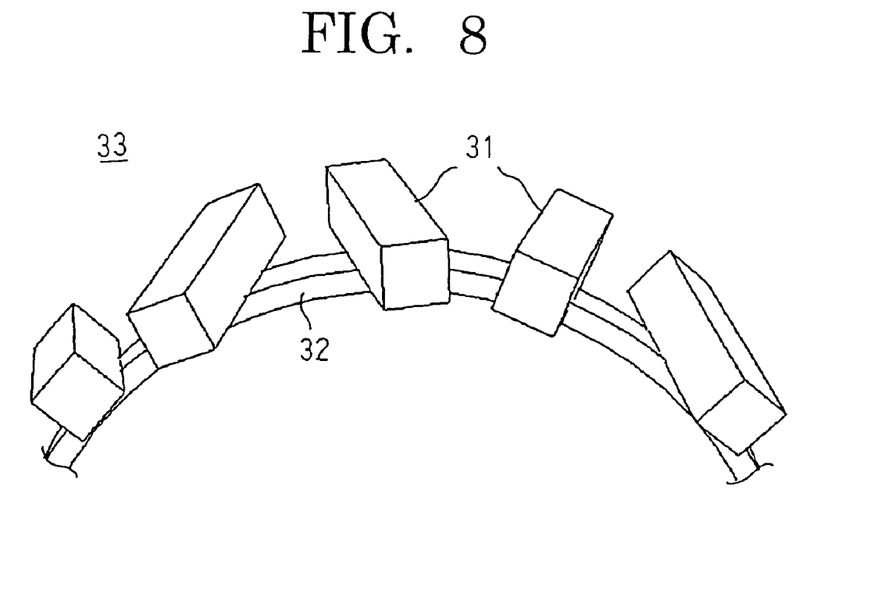
FIG. 8 is a perspective explaining a construction of a linking structure assembly used in the rotor according to Embodiment 3 of the present invention.

FIG. 6 is a longitudinal section showing part of a dynamoelectric machine mounted with a rotor according to Embodiment 3 of the present invention, FIG. 7 is a perspective showing part of the dynamoelectric machine mounted with the rotor according to Embodiment 3 of the present invention, and FIG. 8 is a perspective explaining a construction of a linking structure assembly used in the rotor according to Embodiment 3 of the present invention.

In FIGS. 6 through 8, linking structures 31 are made into generally rectangular parallelepipeds using a resin such as nylon 66, etc., for example, are arranged circumferentially such that an inclination relative to an axial direction of a rotor 7B alternates so as to match gaps between first and second claw-shaped magnetic poles 24A and 24B of the rotor 7B, and are configured into a linking structure assembly 33 by joining central portions of inner peripheral surfaces of each of the linking structures 31 to a ring body 32 made of a stainless alloy, etc., for example, using an adhesive such as a varnish, etc. The linking structures 30 are disposed so as to link adjacent first and second claw-shaped magnetic poles 24A and 24B over a region extending from a tip end portion to a root end portion, and are joined to circumferential side surfaces 24a using an adhesive such as a varnish, etc. In addition, axial end portions of an insulating member 27 wound so as to surround an outer periphery of a field winding 13 are placed in contact with inner peripheral surfaces 24b of the first and second claw-shaped magnetic poles 24A and 24B, and an axially central portion of the insulating member 27 is placed in contact with the ring body 32.

Moreover, the rest of this embodiment is configured in a similar manner to Embodiment 1 above.

In a rotor 7B configured in this manner, the linking structures 31 also link the adjacent first and second claw-shaped magnetic poles 24A and 24B, the field winding 13 is wound so as to have a larger diameter than a root inside diameter of the first and second claw-shaped magnetic poles 24A and 24B, and the insulating member 27 is installed so as to surround an outer periphery of the field winding 13 and is placed in contact with the inner peripheral surfaces 24b of the first and second claw-shaped magnetic poles 24A and 24B and the ring body 32. Thus, overall rigidity of the claw-shaped magnetic poles constituted by the first and second claw-shaped magnetic poles 24A and 24B is increased, and the linking structures 31 act so as to damp vibration of the first and second claw-shaped magnetic poles 24A and 24B. Thus, vibration of the first and second claw-shaped magnetic poles 24A and 24B is suppressed, reducing electromagnetic noise.

In the rotor 7B, because the adjacent first and second claw-shaped magnetic poles 24A and 24B are linked by the linking structures 31 over a region extending from a tip end portion to a root end portion, vibration not only of the claw tip end portion, but of the entire claw of the first and second claw-shaped magnetic poles 24A and 24B is suppressed, further reducing electromagnetic noise. Because gaps between adjacent first and second claw-shaped magnetic poles 24A and 24B are blocked by the linking structures 31 over a region extending from a tip end portion to a root end portion, even if circumstances arise in which the outer periphery of the rotor core 14 must be machined after assembling the rotor 7B in order to increase outer peripheral precision of the rotor core 14, the linking structures 31 prevent cuttings generated by machining from penetrating inside the rotor magnetic poles, suppressing the occurrence of insulation failure between the field winding 13 and the rotor core 14 resulting from penetration of the cuttings and enabling fraction defective to be reduced.

In addition, because the linking structure assembly 33 is configured by joining the linking structures 31 disposed in the respective gaps between the first and second claw-shaped magnetic poles 24A and 24B to the ring body 32 integrally, the linking structures 31 can be prevented from scattering as a result of centrifugal force occurring due to rotation of the rotor 7B. Since the linking structures 31 linking the first and second claw-shaped magnetic poles 24A and 24B are themselves linked by the ring body 32, movement of the linking structures 31 themselves is restricted, and vibration of the linking structures 31 is also suppressed, further reducing electromagnetic noise. In addition, because the linking structure assembly 33 can be installed simultaneously as the first and second cores 21A and 21B and the field winding 13 are being assembled, complicated operations such as mounting linking structures 31 into each of the gaps between the first and second claw-shaped magnetic poles 24A and 24B individually after the first and second cores 21A and 21B and the field winding 13 have been assembled are no longer necessary, improving workability when manufacturing a rotor.

Embodiment 4

Figure 9:
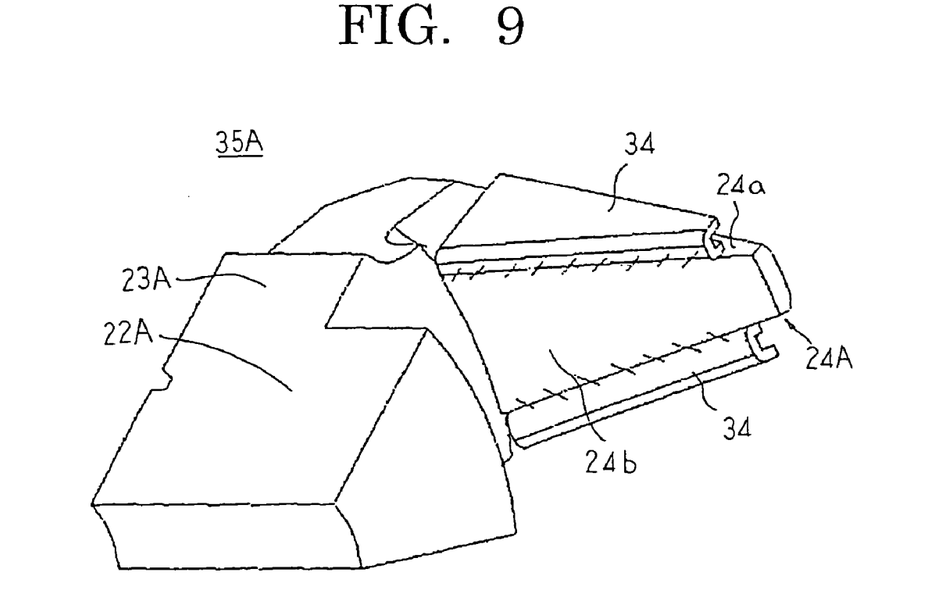
FIG. 9 is a partial perspective explaining a construction of a core assembly in a rotor according to Embodiment 4 of the present invention.
Figure 10:
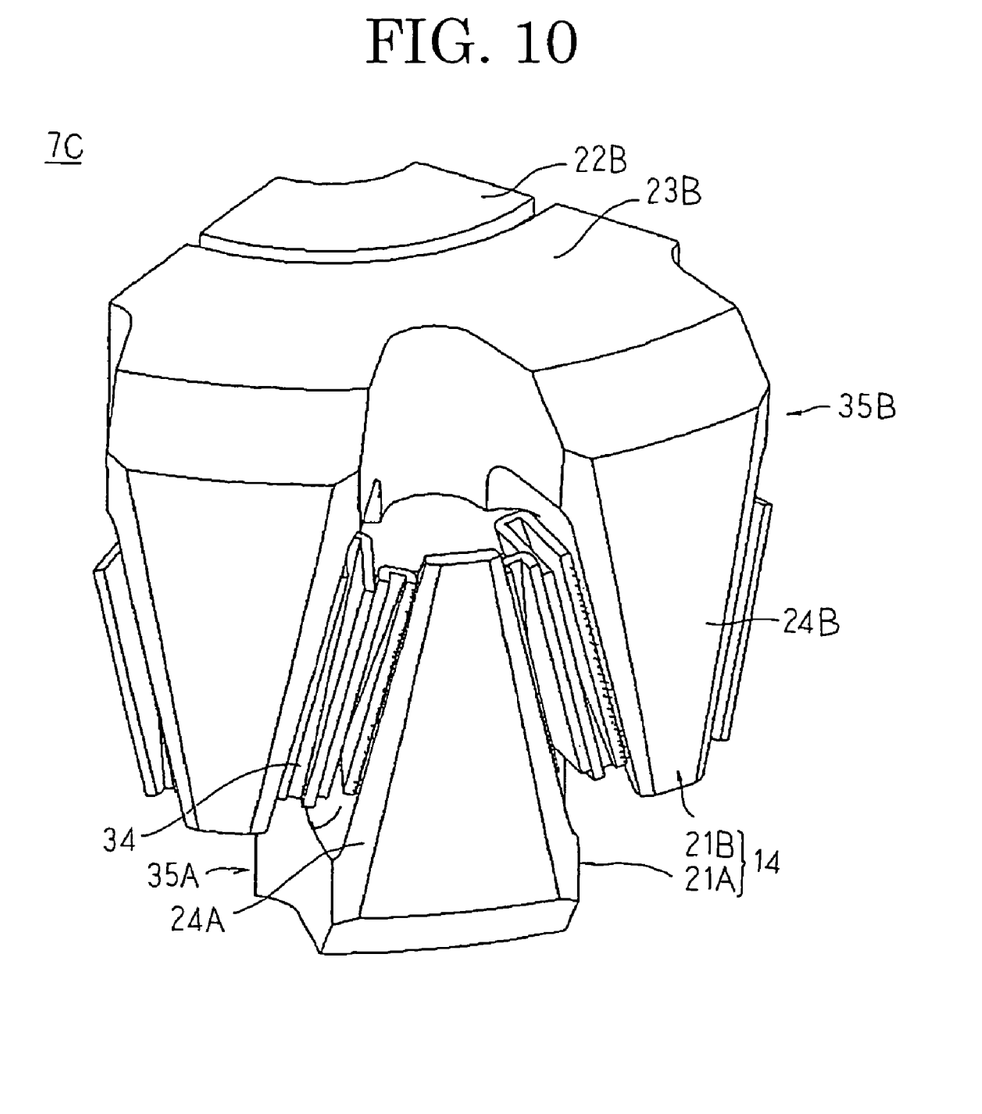
FIG. 10 is a perspective showing part of a rotor according to Embodiment 4 of the present invention.

FIG. 9 is a partial perspective explaining a construction of a core assembly in a rotor according to Embodiment 4 of the present invention, and FIG. 10 is a perspective showing part of a rotor according to Embodiment 4 of the present invention.

In FIGS. 9 and 10, linking structures 34 are produced by bending a plate of a metal such as a stainless alloy, etc., for example, into a general U shape having side surface shapes similar to those of circumferential side surfaces 24a of first and second claw-shaped magnetic poles 24A and 24B. A first core assembly 35A is produced by placing the linking structures 34 on each of the circumferential side surfaces 24a of the first claw-shaped magnetic poles 24A and joining them together by welding. A second core assembly 35B is produced by placing the linking structures 34 on each of the circumferential side surfaces 24a of the second claw-shaped magnetic poles 24B and joining them together by welding.

Side surfaces of the linking structures 34 joined to facing circumferential side surfaces 24a of adjacent first and second claw-shaped magnetic poles 24A and 24B are placed in contact with each other.

Moreover, the rest of this embodiment is configured in a similar manner to Embodiment 1 above.

In a rotor 7C configured in this manner, the linking structures 34 also link the adjacent first and second claw-shaped magnetic poles 24A and 24B, the field winding 13 is wound so as to have a larger diameter than a root inside diameter of the first and second claw-shaped magnetic poles 24A and 24B, and the insulating member 27 is installed so as to surround an outer periphery of the field winding 13 and is placed in contact with the inner peripheral surfaces 24b of the first and second claw-shaped magnetic poles 24A and 24B. Thus, vibration of the first and second claw-shaped magnetic poles 24A and 24B is suppressed in a similar manner to Embodiment 1 above, reducing electromagnetic noise.

In the rotor 7C, because the adjacent first and second claw-shaped magnetic poles 24A and 24B are linked by the linking structures 34 over a region extending from a tip end portion to a root end portion, vibration not only of the claw tip end portion, but of the entire claw of the first and second claw-shaped magnetic poles 24A and 24B is suppressed, further reducing electromagnetic noise. Because gaps between adjacent first and second claw-shaped magnetic poles 24A and 24B are blocked by the linking structures 34 over a region extending from a tip end portion to a root end portion, even if circumstances arise in which the outer periphery of the rotor core 14 must be machined after assembling the rotor 7C in order to increase outer peripheral precision of the rotor core 14, the linking structures 34 prevent cuttings generated by machining from penetrating inside the rotor magnetic poles, suppressing the occurrence of insulation failure between the field winding 13 and the rotor core 14 resulting from penetration of the cuttings and enabling fraction defective to be reduced.

In addition, because the first and second core assemblies 35A and 35B are produced by welding the linking structures 34 to the first and second claw-shaped magnetic poles 24A and 24B, the linking structures 34 can be prevented from scattering as a result of centrifugal force occurring due to rotation of the rotor 7C. The rotor 7C, in which the linking structures 34 are disposed so as to link adjacent first and second claw-shaped magnetic poles 24A and 24B, is obtained by assembling the first and second cores assembly 35A and 35B and the field winding 13. Thus, complicated operations such as mounting linking structures 34 individually after the first and second cores 21A and 21B have been assembled are no longer necessary, improving workability when manufacturing a rotor.

Moreover, in Embodiment 4 above, sides of adjacent linking structures 34 are explained as being placed in contact with each other, but sides of adjacent linking structures 34 may also be joined to each other by welding, or using an adhesive such as a varnish, etc.

Embodiment 5

Figure 11:
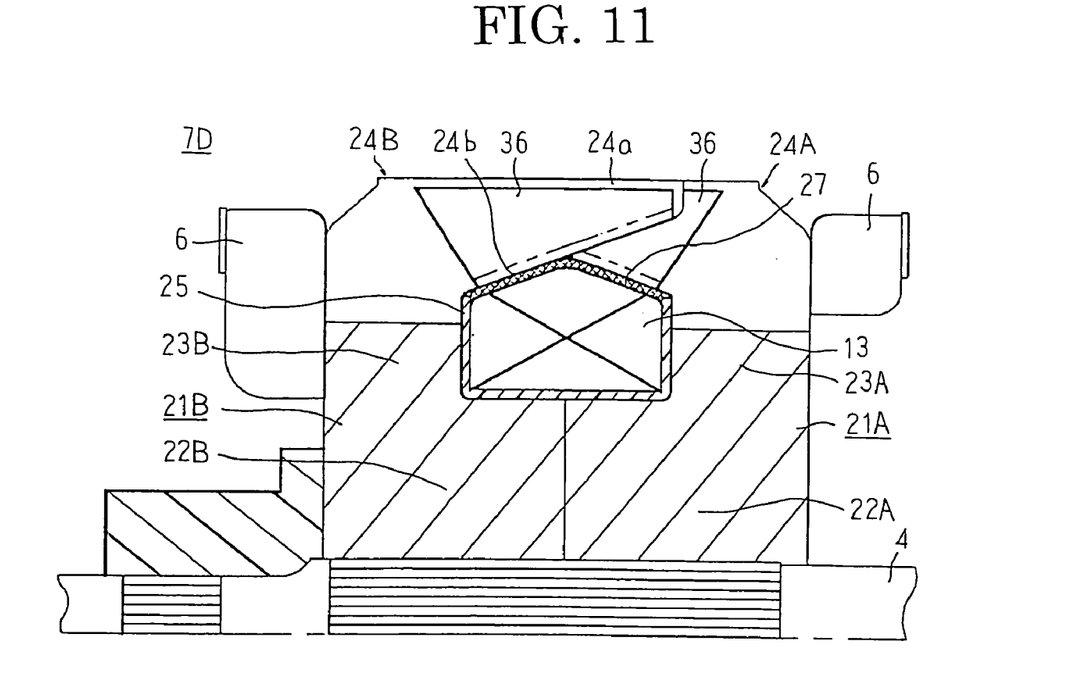
FIG. 11 is a longitudinal section showing part of a dynamoelectric machine mounted with a rotor according to Embodiment 5 of the present invention.
Figure 12:
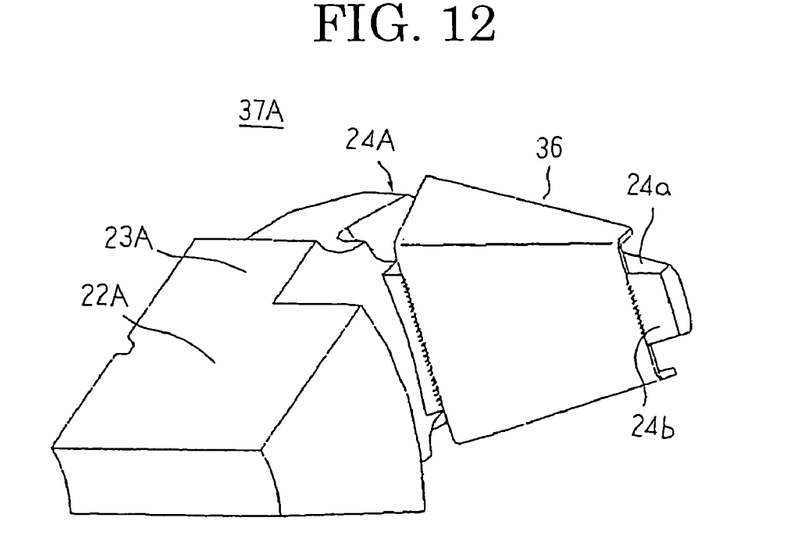
FIG. 12 is a partial perspective explaining a construction of a core assembly in the rotor according to Embodiment 5 of the present invention.
Figure 13:
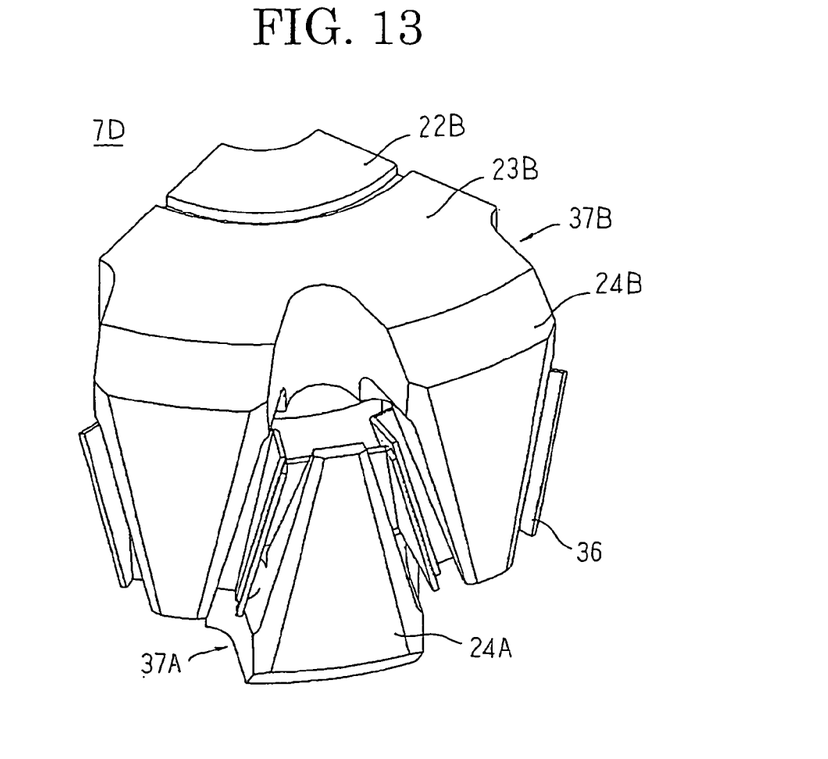
FIG. 13 is a perspective showing part of the rotor according to Embodiment 5 of the present invention.

FIG. 11 is a longitudinal section showing part of a dynamoelectric machine mounted with a rotor according to Embodiment 5 of the present invention, FIG. 12 is a partial perspective explaining a construction of a core assembly in the rotor according to Embodiment 5 of the present invention, and FIG. 13 is a perspective showing part of the rotor according to Embodiment 5 of the present invention.

In FIGS. 11 through 13, linking structures 36 are produced by bending a plate of a metal such as a stainless alloy, etc., for example, into a shape having an angular C-shaped cross section. A first core assembly 37A is produced by placing the linking structures 36 on each of the inner peripheral surfaces 24b of the first claw-shaped magnetic poles 24A such that two sides of the angular C shape face circumferential side surfaces 24a of the first claw-shaped magnetic poles 24A and joining them together using an adhesive or by welding. A second core assembly 37B is produced by placing the linking structures 36 on each of the inner peripheral surfaces 24b of the second claw-shaped magnetic poles 24B such that two sides of the angular C shape face circumferential side surfaces 24a of the second claw-shaped magnetic poles 24B and joining them together using an adhesive or by welding. Side surfaces of the linking structures 36 joined to adjacent first and second claw-shaped magnetic poles 24A and 24B are placed in contact with each other. In addition, an insulating member 27 wound so as to surround an outer periphery of a field winding 13 is placed in contact with the linking structures 36.

Moreover, the rest of this embodiment is configured in a similar manner to Embodiment 4 above.

In a rotor 7D configured in this manner, the linking structures 36 also link the adjacent first and second claw-shaped magnetic poles 24A and 24B, the field winding 13 is wound so as to have a larger diameter than a root inside diameter of the first and second claw-shaped magnetic poles 24A and 24B, and the insulating member 27 is installed so as to surround an outer periphery of the field winding 13 and is placed in contact with the linking structures 36 joined to the inner peripheral surfaces 24b of the first and second claw-shaped magnetic poles 24A and 24B. Thus, vibration of the first and second claw-shaped magnetic poles 24A and 24B is suppressed in a similar manner to Embodiment 4 above, reducing electromagnetic noise.

In the rotor 7D, because the adjacent first and second claw-shaped magnetic poles 24A and 24B are also linked by the linking structures 36 over a region extending from a tip end portion to a root end portion, vibration not only of the claw tip end portion, but of the entire claw of the first and second claw-shaped magnetic poles 24A and 24B is suppressed, further reducing electromagnetic noise. Because gaps between adjacent first and second claw-shaped magnetic poles 24A and 24B are blocked by the linking structures 36 over a region extending from a tip end portion to a root end portion, even if circumstances arise in which the outer periphery of the rotor core 14 must be machined after assembling the rotor 7D in order to increase outer peripheral precision of the rotor core 14, the linking structures 36 prevent cuttings generated by machining from penetrating inside the rotor magnetic poles, suppressing the occurrence of insulation failure between the field winding 13 and the rotor core 14 resulting from penetration of the cuttings and enabling fraction defective to be reduced.

In addition, because the first and second core assemblies 37A and 37B are produced by joining the linking structures 36 to the first and second claw-shaped magnetic poles 24A and 24B, the linking structures 36 can be prevented from scattering as a result of centrifugal force occurring due to rotation of the rotor 7D. The rotor 7D, in which the linking structures 36 are disposed so as to link adjacent first and second claw-shaped magnetic poles 24A and 24B, is obtained by assembling the first and second cores assembly 37A and 37B and the field winding 13. Thus, complicated operations such as mounting linking structures 36 individually after the first and second cores 21A and 21B have been assembled are no longer necessary, improving workability when manufacturing a rotor.

Moreover, in Embodiment 5 above, sides of adjacent linking structures 36 are explained as being placed in contact with each other, but sides of adjacent linking structures 36 may also be joined to each other by welding, or using an adhesive such as a varnish, etc.

In Embodiment 5 above, the linking structures 36 are produced using metal plates of a metal such as a stainless alloy, etc., but linking structures may also be produced using a resin. In that case, the insulating member 27 can be eliminated because the resin linking structures are interposed between the field winding 13 and the first and second claw-shaped magnetic poles 24A and 24B, ensuring electrical insulation between them.

Embodiment 6

Figure 14:
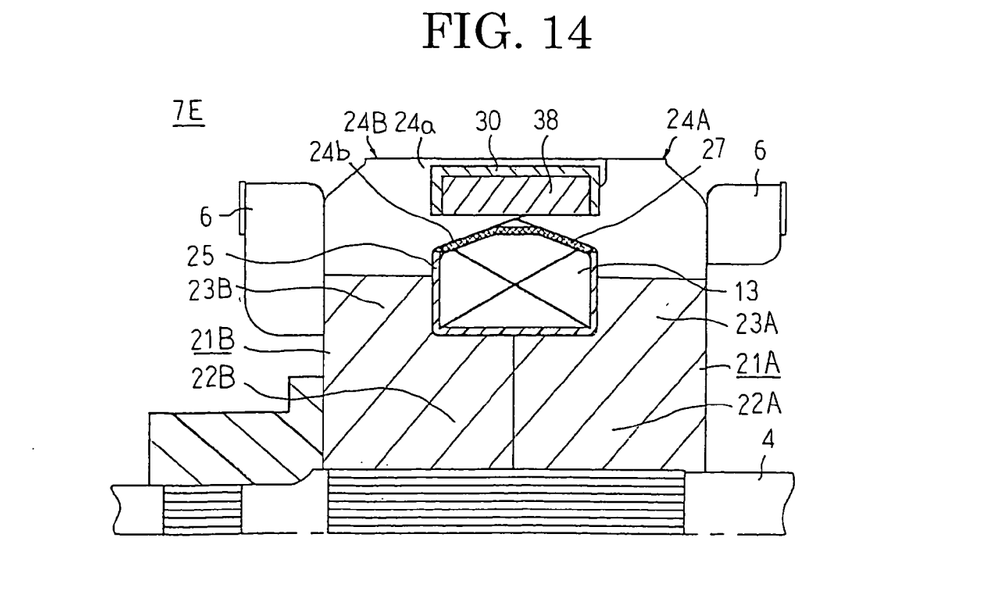
FIG. 14 is a longitudinal section showing part of a dynamoelectric machine mounted with a rotor according to Embodiment 6 of the present invention.
Figure 15:
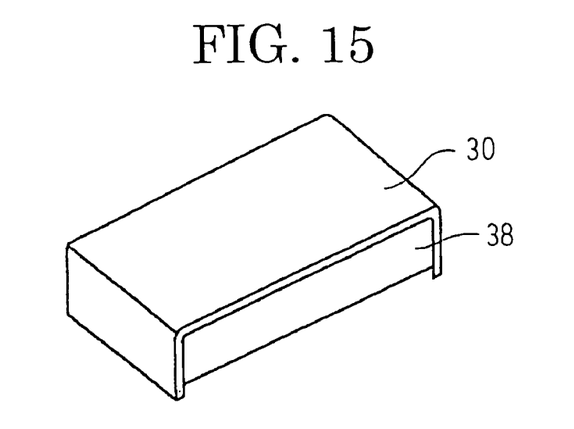
FIG. 15 is a perspective showing a linking structure used in the rotor according to Embodiment 6 of the present invention.

FIG. 14 is a longitudinal section showing part of a dynamoelectric machine mounted with a rotor according to Embodiment 6 of the present invention, and FIG. 15 is a perspective showing a linking structure used in the rotor according to Embodiment 6 of the present invention.

In FIGS. 14 and 15, permanent magnets 38 are fixed inside linking structures 30 using an adhesive.

Moreover, the rest of this embodiment is configured in a similar manner to Embodiment 2 above.

In a rotor 7E configured in this manner, in addition to the effects of Embodiment 2 above, magnetic leakage flux between the first and second claw-shaped magnetic poles 24A and 24B is reduced because permanent magnets 38 are disposed between adjacent first and second claw-shaped magnetic poles 24A and 24B, improving output.

There is a tendency for electromagnetic noise to be aggravated due to the permanent magnets 38 being disposed. However, because adjacent first and second claw-shaped magnetic poles 24A and 24B are linked by the linking structures 30, vibration of the first and second claw-shaped magnetic poles 24A and 24B is suppressed, enabling improvements in output while suppressing the aggravation of electromagnetic noise due to vibration of the first and second claw-shaped magnetic poles 24A and 24B.

Embodiment 7

Figure 16:
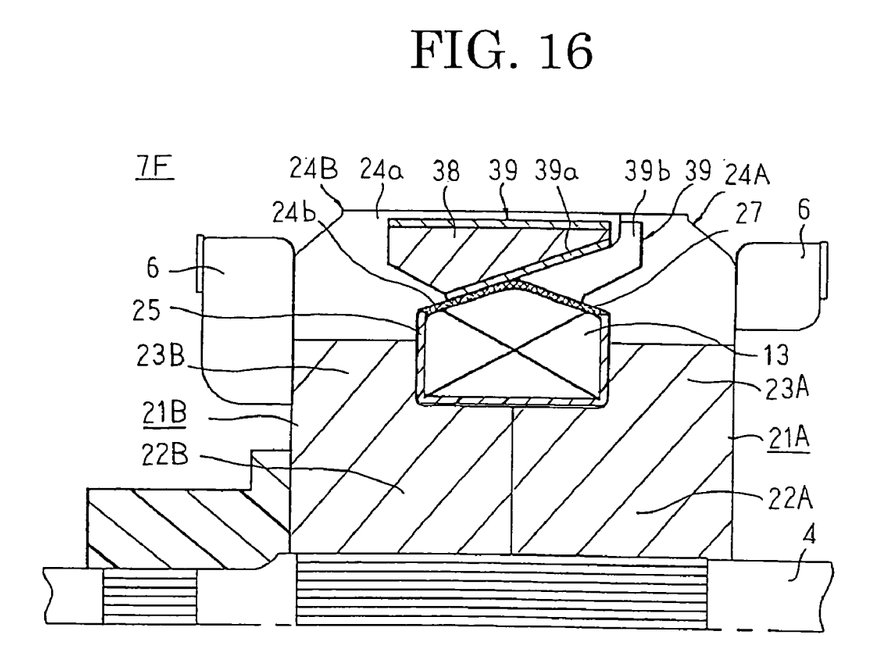
FIG. 16 is a longitudinal section showing part of a dynamoelectric machine mounted with a rotor according to Embodiment 7 of the present invention.
Figure 17:
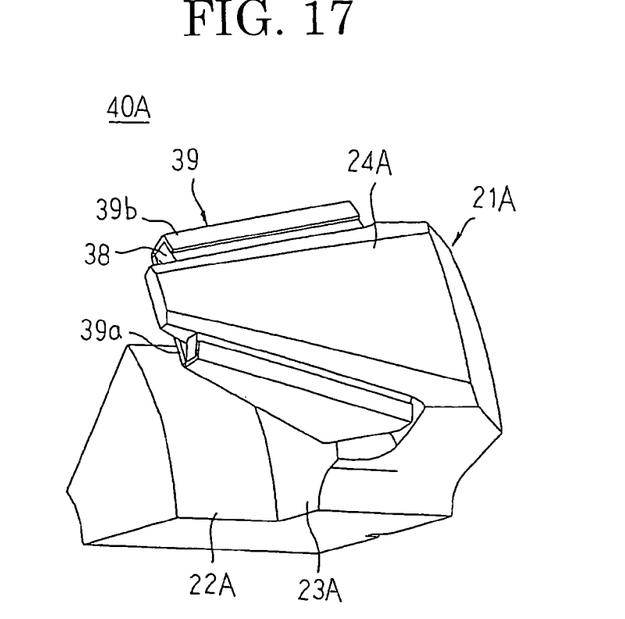
FIG. 17 is a partial perspective explaining a construction of a core assembly in the rotor according to Embodiment 7 of the present invention.
Figure 18:
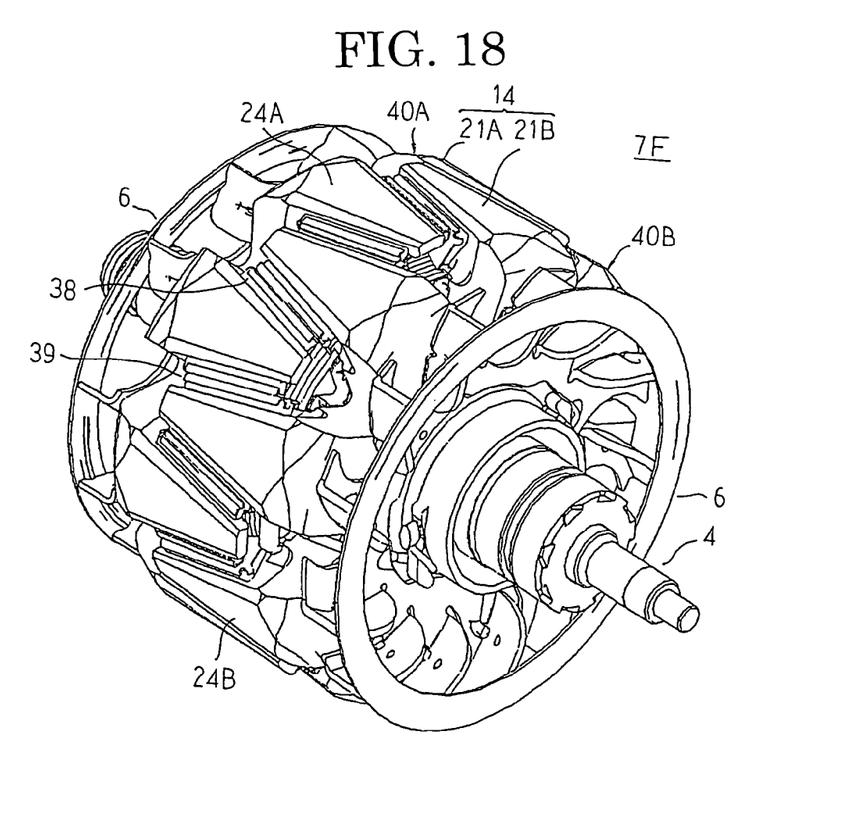
FIG. 18 is a perspective showing the dynamoelectric machine mounted with the rotor according to Embodiment 7 of the present invention.

FIG. 16 is a longitudinal section showing part of a dynamoelectric machine mounted with a rotor according to Embodiment 7 of the present invention, FIG. 17 is a partial perspective explaining a construction of a core assembly in the rotor according to Embodiment 7 of the present invention, and FIG. 18 is a perspective showing the dynamoelectric machine mounted with the rotor according to Embodiment 7 of the present invention.

In FIGS. 16 through 18, linking structures 39 are produced by bending a plate of a metal such as a stainless alloy, etc., for example, into a shape having an angular C-shaped cross section including: a trapezoidal bottom surface portion 39a; and J-shaped wing portions 39b formed on two sides of the bottom surface portion 39a. Permanent magnets 38 are fixed inside the wing portions 39b using an adhesive. A first core assembly 40A is produced by placing the bottom surface portions 39a of the linking structures 39 on each of the inner peripheral surfaces 24b of the first claw-shaped magnetic poles 24A such that the wing portions 39b face circumferential side surfaces 24a of the first claw-shaped magnetic poles 24A and joining them together using an adhesive or by welding. A second core assembly 40B is produced by placing the bottom surface portions 39a of the linking structures 39 on each of the inner peripheral surfaces 24b of the second claw-shaped magnetic poles 24B such that the wing portions 39b face circumferential side surfaces 24a of the second claw-shaped magnetic poles 24B and joining them together using an adhesive or by welding. The wing portions 39b of the linking structures 39 joined to adjacent first and second claw-shaped magnetic poles 24A and 24B are placed in contact with each other. In addition, an insulating member 27 wound so as to surround an outer periphery of a field winding 13 is placed in contact with the bottom surface portions 39a of the linking structures 39.

Moreover, the rest of this embodiment is configured in a similar manner to Embodiment 1 above.

In a rotor 7F configured in this manner, in addition to the effects of Embodiment 1 above, magnetic leakage flux between the first and second claw-shaped magnetic poles 24A and 24B is reduced because permanent magnets 38 are disposed between adjacent first and second claw-shaped magnetic poles 24A and 24B, improving output.

There is a tendency for electromagnetic noise to be aggravated due to the permanent magnets 38 being disposed. However, because adjacent first and second claw-shaped magnetic poles 24A and 24B are linked by the linking structures 39, vibration of the first and second claw-shaped magnetic poles 24A and 24B is suppressed, enabling improvements in output while suppressing the aggravation of electromagnetic noise due to vibration of the first and second claw-shaped magnetic poles 24A and 24B.

Moreover, in each of the above embodiments, all of the pairs of adjacent first and second claw-shaped magnetic poles 24A and 24B are linked by the linking structures, but it is not absolutely necessary for all of the pairs of adjacent first and second claw-shaped magnetic poles 24A and 24B to be linked provided that at least one pair of adjacent first and second claw-shaped magnetic poles 24A and 24B is linked by a linking structure.

Each of the above embodiments are explained as being applied to a Lundell rotor having fans 6 affixed to first and second axial end surfaces of a rotor core 14, but similar effects can also be achieved by applying the present invention to a Lundell rotor in which fans 6 are omitted. In that case, the dynamoelectric machine to which the rotor is mounted should include a water-cooled cooling mechanism, or an external fan, etc.

The invention claimed is:

1. A dynamoelectric rotor comprising:
   a Lundell rotor core having:
   a cylindrical boss portion;
   yoke portions respectively disposed so as to extend radially outward from two axial end edge portions of said boss portion; and
   a plurality of claw-shaped magnetic poles disposed so as to extend axially from outer peripheral portions of said yoke portions so as to intermesh with each other alternately;
   a field winding installed on said boss portion; and
   a plurality of linking structures made of a nonmagnetic material for linking a tip end portion and a root end portion of at least one adjacent pair of said claw-shaped magnetic poles, wherein one of said linking structures is mounted to each of said adjacent claw-shaped magnetic poles and adjacent pairs of said linking structures are placed in contact with each other or are joined together between said claw-shaped magnetic poles,
   wherein:
   said field winding is wound onto said boss portion so as to have a larger diameter than a root inside diameter of said claw-shaped magnetic poles and is placed in contact with an inner peripheral surface of at least one of said claw-shaped magnetic poles with an insulating member interposed.

2. The dynamoelectric rotor according to claim 1, wherein:
a region of said adjacent claw-shaped magnetic poles extending from the tip end portion to the root end portion is linked by said linking structure.

3. The dynamoelectric rotor according to claim 1, wherein:
a plurality of said pairs of adjacent claw-shaped magnetic poles are linked by a plurality of said linking structures and said linking structures are linked circumferentially.

4. The dynamoelectric rotor according to claim 1, wherein:
a portion of each of said linking structures is interposed between said insulating member and the inner peripheral surface of said claw-shaped magnetic pole.

5. The dynamoelectric rotor according to claim 4, wherein:
each of said linking structures is made of an insulating material and said insulating member is constituted by a portion of said linking structures.

6. The dynamoelectric rotor according to claim 1, wherein:
a magnet for reducing leakage of magnetic flux between said adjacent claw-shaped magnetic poles is held by said linking structure.

7. A dynamoelectric rotor comprising:
a Lundell rotor core having:
a cylindrical boss portion;
yoke portions respectively disposed so as to extend radially outward from two axial end edge portions of said boss portion; and
a plurality of claw-shaped magnetic poles disposed so as to extend axially from outer peripheral portions of said yoke portions so as to intermesh with each other alternately;
a field winding installed on said boss portion; and
a plurality of linking structures made of a nonmagnetic material for linking a tip end portion and a root end portion of at least one adjacent pair of said claw-shaped magnetic poles,
wherein:
said field winding is wound onto said boss portion so as to have a larger diameter than a root inside diameter of said claw-shaped magnetic poles and is placed in contact with an inner peripheral surface of at least one of said linking structures with an insulating member interposed.

8. The dynamoelectric rotor according to claim 7, wherein:
a region of said adjacent claw-shaped magnetic poles extending from the tip end portion to the root end portion is linked by said linking structure.

9. The dynamoelectric rotor according to claim 7, wherein:
a plurality of said pairs of adjacent claw-shaped magnetic poles are linked by a plurality of said linking structures and said linking structures are linked circumferentially.

10. The dynamoelectric rotor according to claim 7, wherein:
one of said linking structures is mounted to each of said adjacent claw-shaped magnetic poles and adjacent pairs of said linking structures are placed in contact with each other or are joined together between said claw-shaped magnetic poles.

11. The dynamoelectric rotor according to claim 10, wherein:
a portion of each of said linking structures is interposed between said insulating member and the inner peripheral surface of said claw-shaped magnetic pole.

12. The dynamoelectric rotor according to claim 11, wherein:
each of said linking structures is made of an insulating material and said insulating member is constituted by a portion of said linking structures.

13. The dynamoelectric rotor according to claim 7, wherein:
a magnet for reducing leakage of magnetic flux between said adjacent claw-shaped magnetic poles is held by said linking structure.

* * * * *